(12) United States Patent
Shappir et al.

(10) Patent No.: US 10,475,524 B2
(45) Date of Patent: Nov. 12, 2019

(54) RECOVERY OF DATA READ FROM MEMORY WITH UNKNOWN POLARITY

(71) Applicant: Apple Inc., Cupertino, CA (US)

(72) Inventors: Assaf Shappir, Ganey Tikva (IL); Eyal Gurgi, Petach Tikva (IL)

(73) Assignee: Apple Inc., Cupertino, CA (US)

( * ) Notice: Subject to any disclaimer, the term of this patent is extended or adjusted under 35 U.S.C. 154(b) by 535 days.

(21) Appl. No.: 15/265,869

(22) Filed: Sep. 15, 2016

(65) Prior Publication Data

US 2018/0074892 A1 Mar. 15, 2018

(51) Int. Cl.
*G11C 29/52* (2006.01)
*G11C 11/22* (2006.01)

(52) U.S. Cl.
CPC .............. *G11C 29/52* (2013.01); *G11C 11/22* (2013.01)

(58) Field of Classification Search
CPC .................................................. H03M 13/2957
USPC ................................. 714/755, 757, 758, 759
See application file for complete search history.

(56) References Cited

U.S. PATENT DOCUMENTS

| | | | |
|---|---|---|---|
| 5,428,621 A * | 6/1995 | Mehrotra | G11C 29/02 714/711 |
| 5,745,403 A | 4/1998 | Taylor | |
| 5,777,921 A | 7/1998 | Takata et al. | |
| 5,912,846 A | 6/1999 | Taylor | |
| 6,590,798 B1 | 7/2003 | Komatsuzaki | |
| 7,271,744 B2 | 9/2007 | Du et al. | |
| 7,328,304 B2 | 2/2008 | Royer, Jr. et al. | |
| 7,936,610 B1 | 5/2011 | Melcher et al. | |
| 8,081,500 B2 | 12/2011 | Taylor et al. | |
| 8,495,438 B2 | 7/2013 | Roine | |
| 8,667,244 B2 | 3/2014 | Hadley et al. | |
| 2005/0226058 A1* | 10/2005 | Lee | G11C 5/04 365/189.05 |
| 2014/0281824 A1 | 9/2014 | Oh et al. | |
| 2015/0356074 A1* | 12/2015 | Issaev | G06F 17/289 704/2 |
| 2016/0224480 A1* | 8/2016 | Ku | G06F 13/1668 |
| 2017/0353195 A1* | 12/2017 | Goel | H03M 13/13 |

* cited by examiner

*Primary Examiner* — Fritz Alphonse
(74) *Attorney, Agent, or Firm* — Kligler & Associates

(57) ABSTRACT

A memory controller includes an interface and circuitry. The interface is configured to communicate with a memory device, which includes multiple memory cells, and which applies refreshing to the memory cells by repeatedly inverting data stored in the memory cells. The circuitry is configured to store input data in a group of the memory cells, to read the stored input data from the group of the memory cells to produce read data, the read data has an actual polarity that is either un-inverted or inverted due to the refreshing of the memory cells in the group, to analyze the read data for identifying the actual polarity of the read data, and to recover the input data from the read data based on the identified actual polarity.

20 Claims, 3 Drawing Sheets

RECOVERY OF DATA READ FROM MEMORY WITH UNKNOWN POLARITY

TECHNICAL FIELD

Embodiments described herein relate generally to data storage, and particularly to methods and systems for recovering data read from memory with unknown polarity.

BACKGROUND

Some types of memory devices refresh the stored data periodically for preserving the information and improving storage reliability. Memory devices of certain technologies, such as Ferroelectric Random Access Memory (FeRAM or FRAM), may suffer from reliability degradation due to an imprint effect, in which the memory cells tend to prefer polarization states corresponding to data that has been stored in these cells for a long period of time.

Methods for mitigating imprint effects are known in the art. For example, U.S. Pat. No. 5,745,403, whose disclosure is incorporated herein by reference, describes a system and a method for mitigating undesired imprint effects in a ferroelectric memory array through the addition of a complementary data path which allows user data to be written to the array in an inverted state and then subsequently read out from the array in a reinverted state in response to the state of at least one indicator bit corresponding to each row of the array.

As another example, U.S. Pat. No. 8,495,438, whose disclosure is incorporated herein by reference, describes a method of reducing imprint of a memory cell. The method comprises adding an inversion condition bit operably associated with one or more memory cells storing a memory word. The inversion condition bit indicates whether the memory word represents an actual payload or an inversion of the actual payload. The inversion condition bit and memory word are selectively toggled by a control circuitry. Inversion is performed by reading the inversion condition bit and memory word and rewriting the memory word back to the one or more memory cells in an inverted or non-inverted state, depending on an inversion condition bit. The inversion condition bit is then written to the inversion status bit value.

SUMMARY

An embodiment that is described herein provides a memory controller that includes an interface and circuitry. The interface is configured to communicate with a memory device, which includes multiple memory cells, and which applies refreshing to the memory cells by repeatedly inverting data stored in the memory cells. The circuitry is configured to store input data in a group of the memory cells, to read the stored input data from the group of the memory cells to produce read data, the read data has an actual polarity that is either un-inverted or inverted due to the refreshing of the memory cells in the group, to analyze the read data for identifying the actual polarity of the read data, and to recover the input data from the read data based on the identified actual polarity.

In some embodiments, the circuitry is configured to identify the actual polarity without receiving an explicit indication of the actual polarity from the memory device. In other embodiments, the circuitry is configured to store the input data after encoding the input data using an Error Correction Code (ECC) that generates first parity bits and second parity bits, such that encoding the input data and an inverted version of input data results in same first parity bits, but results in mutually-inverted second parity bits. In yet other embodiments, the circuitry is further configured to read the stored input data including the first and second parity bits, to perform at least one of a first ECC decoding operation that decodes the read data directly, and a second ECC decoding operation that decodes the read data after inverting the first parity bits, and to identify the actual polarity of the read data based on pass/fail outcomes of the at least one of the first and second ECC decoding operations.

In an embodiment, the circuitry is configured to decide that the actual polarity is un-inverted when the first ECC decoding operation succeeds and the second ECC decoding operation fails, and to recover the input data by outputting the data decoded by the first ECC decoding operation. In another embodiment, the circuitry is configured to decide that the actual polarity is inverted when the second ECC decoding operation succeeds and the first ECC decoding operation fails, and to recover the input data by inverting the data decoded by the second ECC decoding operation. In yet another embodiment, the circuitry is configured to report a readout failure when both the first ECC decoding operation and the second ECC decoding operation have failed, or when both the first ECC decoding operation and the second ECC decoding operation have succeeded. In yet further another embodiment, the circuitry is configured to perform the second ECC decoding operation only in response to a failure of the first ECC decoding operation.

In some embodiments, the memory cells in the group store multiple data pages having respective bit significance values, and the circuitry is configured to read the stored input data belonging to one of the data pages stored in the group, and to identify the actual polarity and recover the stored input data of the one of the data pages. In other embodiments, the memory cells of the memory device include ferroelectric memory cells. In yet other embodiments, the circuitry is configured to set a given bit of the input data to a predefined value prior to encoding, to store the input data after encoding the input data using an Error Correction Code (ECC) that generates parity bits, such that encoding the input data and an inverted version of input data results in same values of the parity bits, and to identify the actual polarity by applying a single decoding operation to the read data to produce decoded data, and checking the given bit in the decoded data.

There is additionally provided, in accordance with an embodiment that is described herein, a method that includes storing input data in a group of memory cells of a memory device, which applies refreshing to the memory cells by repeatedly inverting the data stored in the memory cells. The stored input data is read from the group of the memory cells to produce read data, the read data has an actual polarity that is either un-inverted or inverted due to the refreshing of the memory cells in the group. The read data is analyzed to identify the actual polarity of the read data. The input data is recovered from the read data based on the identified actual polarity.

There is additionally provided, in accordance with an embodiment that is described herein, a storage system that includes a memory and a controller. The memory includes multiple memory cells and applies refreshing to the memory cells by repeatedly inverting data stored in the memory cells. The controller, is configured to store input data in a group of the memory cells, to read the stored input data from the group of the memory cells to produce read data, the read data has an actual polarity that is either un-inverted or inverted due to the refreshing of the memory cells in the group, to analyze the read data to identify the actual polarity of the read data, and to recover the input data from the read data based on the identified actual polarity.

These and other embodiments will be more fully understood from the following detailed description of the embodiments thereof, taken together with the drawings in which:

DETAILED DESCRIPTION OF EMBODIMENTS

Overview

Figure 1:
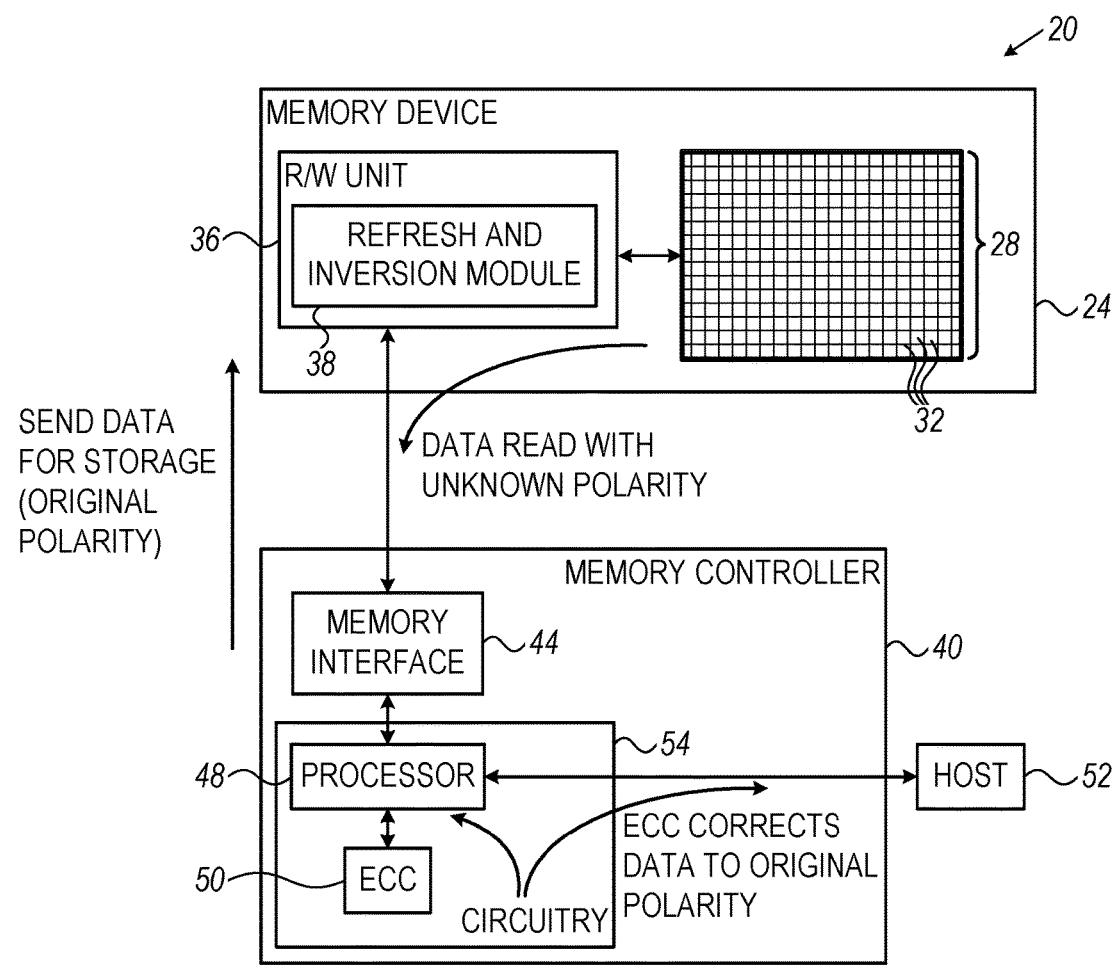
FIG. 1 is a block diagram that schematically illustrates a memory system, in accordance with an embodiment that is described herein.

Memories may suffer impairments of various types, depending (among other factors) on the underlying technology of the memory cells. For example, data retention in some types of memory cells refers to the ability of the memory cells to retain reliable reading of the stored data for long periods of time. Ferroelectric memory cells may be vulnerable to imprint effects, in which the memory cells tend to prefer polarization states to which the memory cell have been programmed for a long period of time. Other impairments comprise, for example, read disturb, program disturb, and/or cosmic radiation that induces bit flipping in the stored data.

One approach to mitigate such impairments is to refresh the stored data repeatedly (e.g., periodically) at a sufficiently high rate. In refreshing, the memory device internally reads the data stored in a group of memory cells and immediately rewrites the read data back to the same memory cells. In some refreshing methods, the refreshing cycle includes inversion of the stored data. Periodic refreshing with inversion assists in mitigating imprint as well as other impairment types such as retention.

In some storage systems, the memory device internally encodes the data to be stored. In such memory devices, the refreshing operation includes decoding the read data to correct readout errors, and re-encoding the decoded data. When the refreshing operation also includes data inversion, parity bits that remain unchanged in the encoded inverted data, are vulnerable to imprint effects. The logic required for decoding and re-encoding typically supports error correction of only one or two bits, and has large costs in terms of chip area, power consumption and refreshing cycle latency.

A controller that stores data in the memory device is typically unaware of the internal refreshing and inversion carried out in the memory device. As a result, the polarity of data read from the memory may be either un-inverted or inverted. To ensure reading the stored data un-inverted, the memory device may track the polarity of the data re-written in the refreshing cycles, and upon a read request from the controller invert the read data as necessary. This approach, however, is costly in terms of additional hardware required and increased power consumption in the memory device.

Embodiments that are described herein provide methods and systems for recovering the data as stored, even though the actual polarity of the read data is unknown. In the disclosed embodiments, the data is stored encoded using an Error Correction Code (ECC) that generates for input data D multiple parity bits. The ECC is designed so that the parity bits comprise disjoint bit-groups denoted P1 and P2 having different behavior under the inversion of the data to be encoded, as described herein.

Let P1(D) and P2(D) denote the parity bits values in the respective groups P1 and P2, resulting by encoding the data D in accordance with the ECC. The parity bits in P1 result in the same values when encoding data D or its inverse polarity version INV(D), i.e., P1(D)=P1[INV(D)]. In contrast, the values of the parity bits in P2 have opposite polarities in encoding D and INV(D), i.e., INV[P2(D)]=P2[INV(D)].

It can be shown that for an ECC that can be represented using a parity-check matrix H, the groups P1 and P2 correspond to rows in H having an even or odd number of nonzero elements, respectively.

The ECC encoder output is referred to as a code word and is denoted CW. Using the above terminology, the code word can be expressed as CW=[D, P1(D),P2(D)].

As described above, the controller stores CW in the memory. Due to the refreshing cycles, however, the read data (denoted R) may have un-inverted or inverted polarity, i.e., R=CW or, R=INV(CW), respectively, assuming the data is read with no errors.

Since CW is a valid code word of the underlying ECC, decoding R=CW recovers the input data D. In addition, it can be shown that due to the property of the ECC regarding the parity bits as described above, decoding R', which is derived from R by inverting the parity bits in the bit-group P1 of R, recovers INV(D). Note that in practical situations the data retrieved from the memory may contain errors. Successful decoding of D or INV(D) as described above is possible when the number of errors is within the ECC capabilities. The decoding principles described above can be used to recover D in various ways, as will be described in detail below.

In some embodiments, to recover the input data D, the controller applies to the data read from the memory (with unknown polarity) two ECC decoding operations. In a first ECC decoding operation the controller attempts to decode the read data R as retrieved, and in a second ECC decoding operation the controller attempts decoding R', which equals the retrieved data R in which the parity bits in the group P1 have all been inverted. Based on the pass/fail outcomes of the first and second ECC decoding operations the controller identifies the actual polarity of the read data, and outputs the decoded data un-inverted or inverted, accordingly.

The controller may apply the ECC decoders and use their pass/fail outcomes to identify the polarity of the read data in various ways. In some embodiments, the controller initially performs the first and second ECC decoding operations, e.g., in parallel. The controller then uses the pass/fail outcomes of both ECC decoding operations to identify the polarity of the read data. For example, the controller identifies the polarity according to successful decoding using one of the ECC decoding operations and failure to decode using the other ECC decoding operation. In such embodiments, performing both the ECC decoding operations in parallel doubles the hardware required for decoding but results in minimal processing latency.

In other embodiments, the controller comprises only one ECC decoder, which decodes R and R' in series. In an example embodiment, the controller starts with decoding R and if the decoding operation succeeds the controller outputs the respective decoded data un-inverted. If decoding R fails, the controller attempts decoding R' and if this decoding operation succeeds the controller outputs the respective decoded data after inverting the decoded data.

In some embodiments, the memory device keeps track of the polarity of the stored data and the controller receives along with the read data indication of the read data polarity. In such embodiments, the controller performs only one decoding operation, based on the indicated polarity.

In some embodiments, the ECC is designed such that for a code word CW=[D, P(D)] that was written to the memory, wherein P(D) denotes the parity bits corresponding to data D, the ECC can decode both CW and its inverse INV(CW)={INV(D),INV[P(D)]}. In such embodiments, the read data can be recovered using a single decoding operation. Moreover, the polarity of the decoded data can be determined by setting a bit in the input data to a predefined value prior to encoding, and checking the bit value following the decoding.

In some embodiments, the memory device comprises a Multi-Level Cell (MLC) device that stores two or more bits per memory cell, by mapping the bits to multiple respective analog values. The controller stores data to the MLC device in units that are referred to as data pages, wherein a data page corresponds to a respective bit significance value. For example, in a 2 bits/cell device, the controller may store (and read) a Least Significant Bit (LSB) page or a Most Significant Bit (MSB) page.

In some embodiments, the MLC device refreshes the memory cells by swapping among all the analog values in a predefined sequence. As will be described in detail below, by carefully selecting the refreshing sequence, it can be guaranteed that the polarity of the entire data page read from the memory is inverted or un-inverted. Therefore, the techniques described above for recovering data with unknown polarity are applicable also to memory devices that store multiple bits per cell.

In the disclosed techniques, strong ECC encoding/decoding operations are carried out upon storing and reading the data rather than as part of the refreshing cycle. As a result, the inversion operation flips all the stored bits including all the parity bits, as required for efficient imprint mitigation. Moreover, by using the disclosed techniques, the power consumption and latency of the refreshing cycles are reduced considerably.

SYSTEM DESCRIPTION

FIG. 1 is a block diagram that schematically illustrates a memory system 20, in accordance with an embodiment that is described herein. System 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

System 20 comprises a memory device 24, which stores data in a memory cell array 28. The memory array comprises multiple memory cells 32, such as analog memory cells. In the context of the present patent application, the term "analog memory cell" is used to describe any memory cell that holds a continuous, analog value of a physical parameter, such as an electrical voltage or charge. In some technologies, such as, for example, technologies that employ ferroelectric materials, the memory cells store analog values of two electrical polarization states. Array 28 may comprise solid-state memory cells 32 of various kinds, such as, for example, phase change RAM (PRAM, also referred to as Phase Change Memory—PCM), Nitride Read Only Memory (NROM), Ferroelectric RAM (FRAM), Resistive RAM (ReRAM or PRAM), Intel's cross point memory technology (3D Xpoint™), magnetic RAM (MRAM) and/or Dynamic RAM (DRAM) cells. Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values, such as polarization states in FeRAMs.

System 20 stores data in the analog memory cells by programming the cells to assume respective memory states, which are also referred to as programming levels. The programming levels are selected from a finite set of possible levels, and each level corresponds to a certain nominal storage value. For example, a 1 bit/cell Single-Level Cell (SLC) can be programmed to assume one of two possible programming levels, and a 2 bit/cell Multi-Level Cell (MLC) can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having an integer resolution of one or more bits. Data is typically written to and read from the memory cells in data units that are referred to as data pages (or simply pages, for brevity).

R/W unit 36 comprises a refresh and inversion module 38, which repeatedly (e.g., periodically) inverts the data stored in array 28. The memory device carries out the refresh plus inversion cycles internally, at a sufficiently high rate, e.g., to mitigate imprint and retention. As a result of the refreshing cycling, the polarity of the data that the R/W unit reads from array may be either un-inverted or inverted. In some embodiments, the R/W unit carries out a refreshing operation without inversion and a refreshing operation with inversion as separate operations. For example, the R/W unit may refresh the data with no inversion at a higher rate than refreshing the data with inversion. In other embodiments, the R/W unit carries out the refreshing plus inversion as a combined operation.

The storage and retrieval of data in and out of memory device 24 is performed by a memory controller 40. Memory controller 40 comprises an interface 44 for communicating with memory device 24, a processor 48, and an Error Correcting Code (ECC) module 50. The disclosed techniques can be carried out in memory controller 40, by processor 48, ECC 50, or both. Thus, in the present context, processor 48 and ECC 50 are referred to collectively as circuitry 54 that carries out the disclosed techniques.

Memory controller 40 communicates with a host 52, for accepting data for storage in the memory device and for outputting data retrieved from the memory device. ECC module 50 encodes the data for storage using a suitable ECC and decodes the ECC of data retrieved from the memory. ECC module 50 may comprise any suitable type of ECC, such as, for example, Low Density Parity Check (LDPC), Reed-Solomon (RS) or Bose-Chaudhuri-Hocquenghem (BCH), can be used. In some embodiments, ECC 50 implements a decoding scheme that resolves the unknown polarity of the data read from the memory. Detailed examples for such schemes are provided further below.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a RAID storage system. Elements that are not necessary for understanding the principles of the present disclosure, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller elements may reside on the same die on which the memory array is disposed. Further alternatively, some or all of the functionality of memory controller 40 can be implemented in software and carried out by a processor (e.g., processor 48) or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. In other embodiments, memory cells 32 comprise ferroelectric cells that are arranged in multiple rows and columns, and each memory cell has a 1T-1C architecture comprising one access transistor and one capacitor whose dielectric layer comprises ferroelectric material such as lead zirconate titanate (PZT). Such a ferroelectric memory cell stores binary values "0" and "1" as one of two possible electric polarizations.

The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

To write data to a ferroelectric memory cell the R/W unit applies a positive or negative electrical field (e.g., voltage) across the ferroelectric layer of the capacitor to write "0" or "1" depending on the polarity of the electrical field.

To read data from a ferroelectric cell, the R/W unit applies an electrical field of a given polarization, and senses a transient electrical current of the cell capacitor. When the polarity of the field applied matches the polarity to which the capacitor was charged, the sensed transient current would be low. When the polarity of the field applied is opposite to the polarity to which the capacitor was charged, the sensed transient current would be significantly higher. As noted, reading the ferroelectric cell is destructive, and therefore the cell should be re-written when the R/W unit senses a high current during the read operation.

In some embodiments, memory pages are sub-divided into sectors. Pages may be mapped to word lines in various manners. Each word line may store one or more pages. A given page may be stored in all the memory cells of a word line, or in a subset of the memory cells (e.g., the odd-order or even-order memory cells).

ECC SCHEMES FOR RECOVERING DATA READ FROM MEMORY WITH UNKNOWN POLARITY

Figure 2:
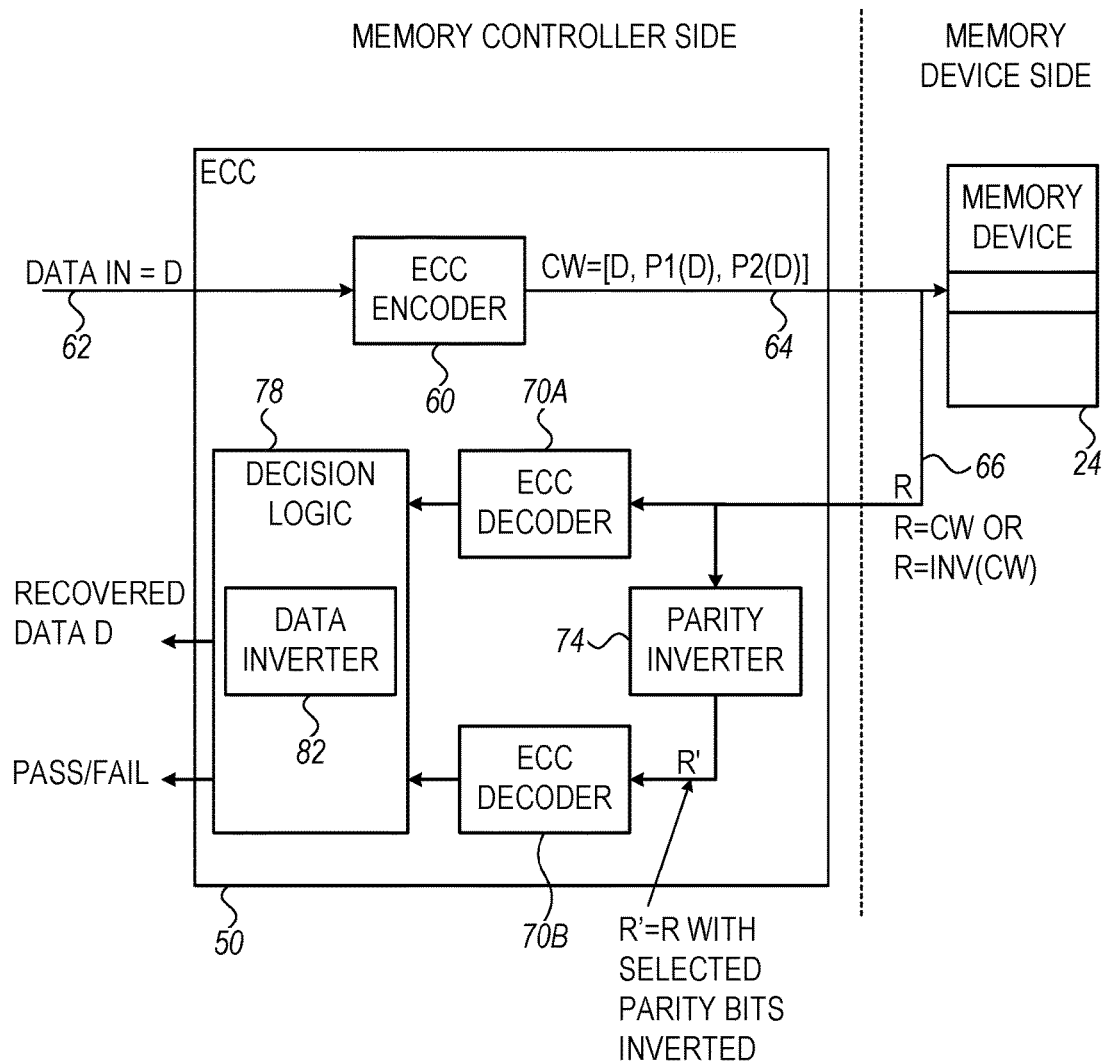
FIG. 2 is a block diagram that schematically illustrates an Error Correction Code (ECC) module that recovers data read from a memory device with unknown polarity, in accordance with an embodiment that is described herein.

FIG. 2 is a block diagram that schematically illustrates an Error Correction Code (ECC) module 50 that recovers data read from a memory device 24 with unknown polarity, in accordance with an embodiment that is described herein. In the present example, memory device refreshes the memory cells by periodically inverting the data stored in the memory cells, e.g., to mitigate imprint effects. ECC 50 implements an encoding and decoding scheme that enables processor 48 to recover data stored in memory device 24 even though the stored data is read with unknown polarity.

ECC module 50 comprises an ECC encoder 60, which encodes input data 62 (denoted D) into a code word 64 (denoted CW) in accordance with the underlying ECC. In the present example, for protecting the data D, ECC encoder 60 generates multiple parity bits that are divided into disjoint bit-groups denoted P1 and P2 that behave differently in encoding D or its inverse polarity version, as will be described in detail below. Note that although the values of the parity bits P1(D) and P2(D) depend on the data D, the manner in which the parity bits are divided among the bit-groups P1 and P2 depends on the underlying ECC but not on the data D.

Code word 64, including data D and the respective parity bits P1(D) and P2(D) are stored in a given location of the memory device. In the example of FIG. 2, for the sake of clarity, code word 64 is represented as CW=[D, P1(D), P2(D)], i.e., the input data D and the two groups of parity bits P1 (D) and P2(D) are separated from one another. In alternative embodiments, ECC encoder 60 can generate code words in which D, P1(D) and P2(D) are interleaved with one another using any suitable interleaving scheme, wherein the bit-groups are separable using respective suitable bit-masks.

As noted above, the bit-groups P1 and P2 behave differently for encoding data with opposite polarities. For bit-group P1, the polarity of the parity bits is independent of the polarity of the input data, i.e., $$P1[INV(D)]=P1(D) \quad \text{Equation 1:}$$

and for bit-group P2, the polarity of the parity bits depends on the polarity of the input data, i.e., $$P2[INV(D)]=INV[P2(D)] \quad \text{Equation 2:}$$

In Equations 1 and 2, the operator INV(•) denotes a bit-wise inversion or bit-flip operation, and P1(•) and P2(•) denote the parity bits in each of the bit-groups P1 and P2 resulting from encoding input D or INV(D).

As seen in Equations 1 and 2, for bit-group P1, encoding D and INV(D) generate the same parity bits. In contrast, for bit-group P2, encoding D and INV(D) results in parity bits that have opposite polarities. It can be shown that for any linear ECC the generated parity bits (or part thereof) can be divided into bit-groups P1 and P2 having the properties described above.

Assuming for the sake of simplicity ideal conditions in which the data storage, refreshing and retrieval are all error-free, data 66 retrieved from the memory location (denoted R in the figure) can be either CW or INV(CW), because reading the memory location is not synchronized to the refreshing cycles in the memory device. When the polarity of the read data is un-inverted, R is given by:

$$R=CW=[D,P1(D),P2(D)] \quad \text{Equation 3:}$$

and when the polarity of the read data is inverted, R is given by:

$$R=INV(CW)=\{INV(D),INV[P1(D)],INV[P2(D)]\} \quad \text{Equation 4:}$$

ECC 50 comprises ECC decoders 70A and 70B that are both designed to decode code words generated by ECC encoder 60. Depending on the underlying ECC, decoders 70A and 70B can correct up to a predefined number T of errors in the read data. When the input to decoder 70A or 70B comprises a code word that contain up to T errors, the decoder can decode this code word successfully. When the number of errors exceeds T, the decoding fails.

Decoder 70A receives data R retrieved from the memory device, and decodes R in accordance with the ECC that was used for encoding using ECC encoder 60. Decoder 70B receives an input denoted R', which equals the read data R in which the parity bits in the bit-group P1 have been inverted. When R=CW, R' is given by:

$$R'=\{D,INV[P1(D)],P2(D)\} \quad \text{Equation 5:}$$

and when R=INV(CW), R' is given by:

$$R'=\{INV(D),P1(D),INV[P2(D)]\} \quad \text{Equation 6:}$$

or using Equations 1 and 2 above, R' in this case equivalently equals:

$$R'=\{INV(D),P1[INV(D)],P2[INV(D)]\} \quad \text{Equation 7:}$$

Note that when R=CW, R in Equation 3 is a valid code word of the ECC, but R=INV(CW) in Equation 4 is generally not a valid code word of this ECC. Therefore ECC decoder 70A can decode R=CW successfully but would typically fail to decode R=INV(CW).

Similarly, since R' derived from R=INV(CW) in Equation 7 is a valid code word of the ECC corresponding to input data INV(D), such R' is decodable by decoder 70B. On the other hand, R' resulting from R=CW in Equation 5 is generally not a valid code word of the ECC and therefore cannot be decoded successfully by decoder 70B. Table 1 below summarizes the conditions for decoding pass/fail outcome.

TABLE 1

ECC decoders possible pass/fail outcomes

| DATA READ FROM MEMORY | DECODER-INPUT | OUTCOME |
|---|---|---|
| R = CW | 70A-R | Succeeds |
| R = CW | 70B-R' | Fails |
| R = INV (CW) | 70A-R | Fails |
| R = INV (CW) | 70B-R' | Succeeds |

As seen in Table 1, when reading from the memory device data with un-inverted polarity, decoder 70A succeeds to decode R=CW but decoder 70B fails to decode the respective R'. Similarly, when reading from the memory device data having inverted polarity R=INV(CW), decoder 70A fails to decode R=INV(CW) and decoder 70B succeeds to decode the respective R'. In other words, at error-free conditions, the described decoding scheme results in only one of decoders 70A and 70B succeeding to decode its respective input R or R'. When the read data contains errors, the probabilities of decoders 70A and 70B to succeed in the decoding operation depends on the error correction capability of the underlying ECC and on the ratio between the number of bits in the bit-groups P1 and P2.

ECC module 50 comprises decision logic 78 that receives decoding pass/fail outcomes as well as decoded data from decoders 70A and 70B. Decision logic 78 uses the decoding pass/fail indications to identify the polarity of the data retrieved from the memory.

In some embodiments, to identify the polarity, logic 78 requires pass/fail outcomes from both decoders 70A and 70B. In such embodiments, ECC 50 executes both decoders (e.g., in parallel for minimal latency) before logic 78 decides on the polarity. In these embodiments, the polarity decision is valid only if one decoder has succeeded and the other decoder has failed. In an embodiment, when both decoders fail or succeed, logic 78 reports a readout failure.

In other embodiments, ECC 50 executes decoders 70A and 70B in series, i.e., ECC 50 first attempts decoding using one of the decoders, and executes the other decoder only if the first decoding fails. For example, starting with decoder 70A, if the decoding succeeds, logic 78 decided that the polarity is un-inverted and skips the decoding using decoder 70B. Otherwise, ECC 50 executes decoder 70B, and if this decoding succeeds, logic 78 decides that the polarity is inverted. When both decoders fail, logic 78 reports a readout failure.

Decision logic 78 recovers the data that was stored in the memory based on the decided polarity. In an embodiment, when logic 78 decides that the polarity is un-inverted, logic 78 outputs the decoded data of decoder 70A, and when logic 78 decides that the polarity is inverted, logic 78 inverts the data decoded from decoder 78B using data inverter 82 and outputs the inverted result.

As described above, determining the polarity of the read data depends on the pass/fail results of decoders 70A and 70B. In some embodiments, to ensure the same or similar decoding pass/fail probabilities in decoders 70A and 70B, the ECC is designed so that the bit-groups P1 and P2 comprise the same number of parity bits. Alternatively, the difference between the number of bits in the bit-groups P1 and P2 is smaller than a predefined difference threshold.

The configuration of ECC 50 in FIG. 2 is given by way of example, and other suitable ECC configurations can also be used. For example, although ECC 50 comprises two ECC decoders 70A and 70B, in alternative embodiments, ECC 50 comprises a single ECC decoder, which is configured to decode R and R' in series.

Figure 3:
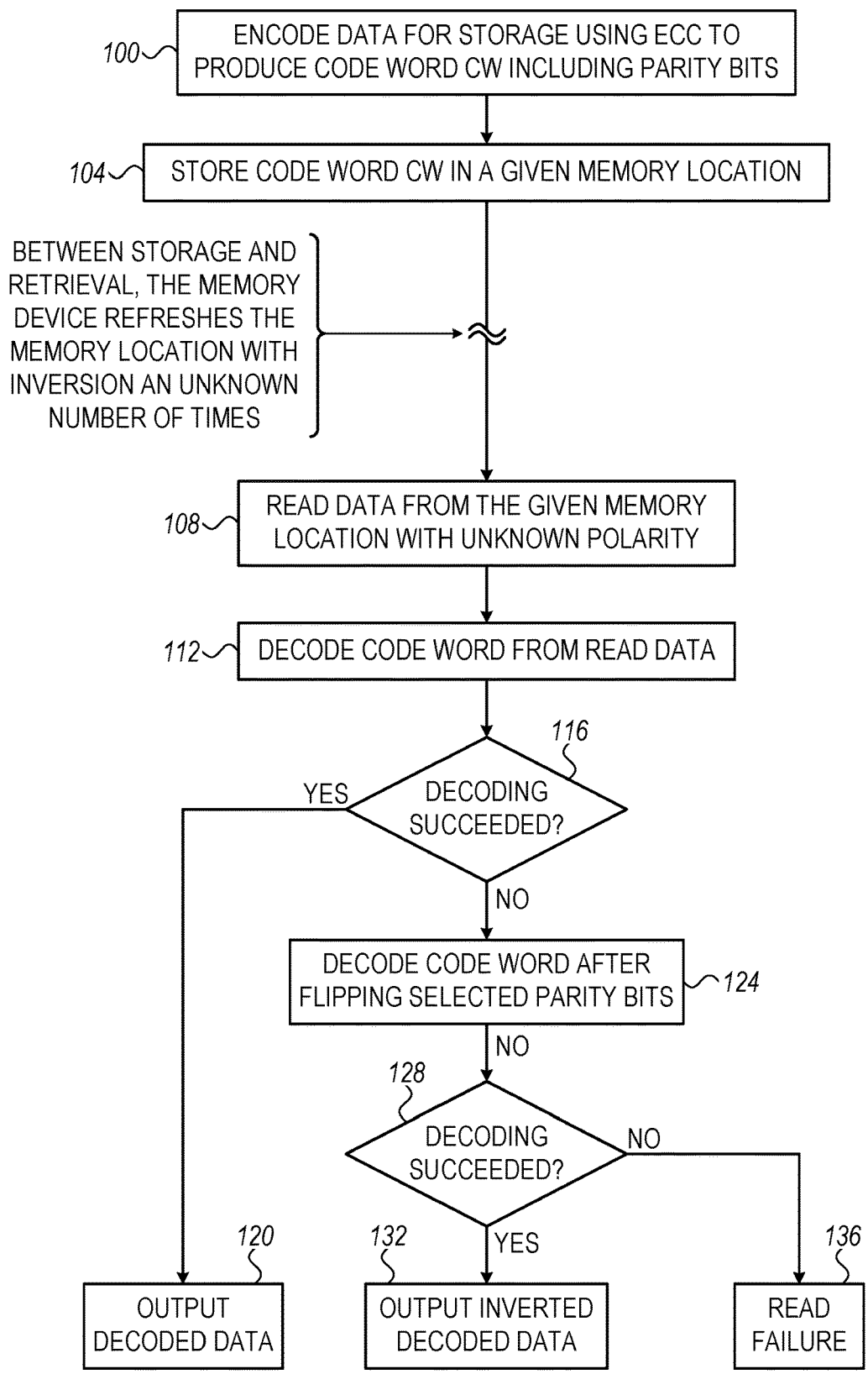
FIG. 3 is a flow chart that schematically illustrates a method for recovering data read from a memory device with unknown polarity, in accordance with an embodiment that is described herein.

FIG. 3 is a flow chart that schematically illustrates a method for recovering data read from a memory device with unknown polarity, in accordance with an embodiment that is described herein. The method is described as being executed by processor 48. Alternatively, the method can be executed by circuitry 54 of memory controller 40, i.e., by processor 48, ECC 50 or in combination of both processor 48 and ECC 50.

The method begins with processor 48 encoding data for storage, at an encoding step 100. The data prior to encoding, denoted D, may be provided by host 52 or originate within memory controller 40. The processor encodes data D using an ECC that generates a code word CW containing D and multiple parity bits that are divided into bit-groups P1 and P2 that satisfy Equations 1 and 2 above, in which P1(D) and P2(D) denote that parity bits in P1 and P2 corresponding to encoding D. In some embodiments CW can be expressed as CW=[D, P1(D), P2(D)]. In other embodiments, D, P1(D) and P2(D) in CW are interleaved with one another using any suitable interleaving scheme. At a writing step 104, the processor stores the code word CW in a given location of the memory device.

At a retrieval step 108, the processor reads back the code word that was stored in the given memory location. Since reading the stored data is not synchronized to the refreshing and inversion cycles carried out internally by the memory device, the stored data is read with unknown polarity. Additionally, the data read may contain one or more errors.

At a first decoding step 112, the processor attempts to recover D by decoding the code word CW from the read data. At a first verification step 116, the processor checks whether the first decoding has succeeded, and if so outputs the decoded data D, at an output step 120, and the method terminates. Otherwise the first decoding has failed, and the processor attempts a second decoding to the read data, in which the parity bits in bit-group P1 are flipped, at a second decoding step 124. At a second verification step 128, the processor checks whether the second decoding has succeeded, and if so the processor inverts the decoded data of the second decoding operation and outputs the inverted result, at an inverted output step 132, and the method terminates. Otherwise, the second decoding has also failed, and the processor reports a readout failure, at a failure reporting step 136, and the method then terminates.

In some embodiments, the memory device tracks the changes in the polarity state of the data stored caused by the refreshing and inversion cycles. For example, the memory device may allocate for a group of memory cells a bit for storing inverted or un-inverted polarity state for the entire group of the memory cells. In these embodiments, when the memory controller retrieves stored data, the memory controller receives the data together with the polarity indication, and performs only one decoding operation based on the indication. If the polarity is un-inverted, the processor decodes the read data and outputs the decoded data. Otherwise, the polarity is inverted, and the processor decodes the read data after flipping the parity bits in the bit-group P1 of the read data, and outputs the decoded data inverted.

In some embodiments, ECC 50 is designed such that P[INV(D)]=P(D) for the entire parity bits P. In other words, the polarity of all the parity bits P is independent on the polarity of the data D, as specified for the bit-group P1 in Equation 1. In such embodiments, the read data is decodable, using a single decoding operation, regardless of its polarity, as long as the number of errors in the read data is within the ECC capabilities. In an embodiment, a bit of D is set to a predefined value prior to encoding. In the decoded read data, the polarity of this bit is checked to determine the polarity of the read data, i.e., whether the read data should be inverted or not.

Similar embodiments that require only a single decoding operation are applicable for the case in which all the parity bits belong to the bit-group P2 as specified in Equation 2, i.e., when all the parity bits P satisfy P[INV(D)]=INV[P(D)]. In this case the parity bits are inverted before decoding the read data.

EXTENSIONS TO MEMORY DEVICES THAT STORE MULTIPLE BITS PER MEMORY CELL

In the embodiments described above, we mainly assumed that memory device 24 comprises a Single-Level Cell (SLC) device that stores 1 bit/cell. Now we describe how the disclosed techniques are applicable also for memory devices that store 2 bits/cell or more.

Consider, for example, a Multi-Level Cell (MLC) device that stores 2 bits/cell. Such a device stores data in four analog values or programming levels that map bit-pairs as follows:

PV0: (1, 1)
PV1: (1, 0)
PV2: (0, 0)
PV3: (0, 1) wherein the left and right bits in each bit-pair, represents a Most Significant Bit (MSB) and a Least Significant Bit (LSB), respectively. Alternatively, other suitable mapping can also be used.

In some types of MLC devices of this sort, it is advantageous to refresh a group of memory cells so that a group of the memory cells does not store the same data for a long period of time. In some embodiments, a refreshing scheme re-writes the memory cells in the group so that each cell is programmed in some sequence to all of the possible programming levels, but retains each programming level for only a short period of time. Similarly to the SLC case, reading the stored data is not synchronized to the refreshing process and therefore upon read a given cell be programmed to any of the possible programming levels.

In the description that follows we describe a refreshing scheme that guaranties that reading a LSB data page or a MSB data page results in reading the entire data page inverted or un-inverted. The refreshing scheme comprises two steps. In the first step, the level PV0 is exchanged with level PV3, and level PV1 is exchanged with level PV2. In the second step, the level PV0 is exchanged with level PV1, and level PV2 is exchanged with level PV3. Refreshing using step 1 results in the inversion of the entire MSB page and does not change the polarity of the respective LSB page. Similarly, refreshing using step 2 flips the polarity of the entire LSB page, and leaves the polarity of the respective MSB page unchanged. Table below summarizes the programming levels swapping in step 1 and step 2.

TABLE 2 programming level swapping for refresh

| From level | To level-STEP1 | To level-STEP2 |
|---|---|---|
| PV0 | PV3 | PV1 |
| PV1 | PV2 | PV0 |

TABLE 2-continued programming level swapping for refresh

| From level | To level-STEP1 | To level-STEP2 |
|---|---|---|
| PV2 | PV1 | PV3 |
| PV3 | PV0 | PV2 |

By alternating between refreshing steps 1 and 2, each cell goes through all the programming levels. For example, a cell that is initially programmed to PV0, goes through the sequence of programming levels PV0, PV3, PV2, PV1, PV0, and so on.

When the memory controller reads a LSB page or an LSB page from a MLC device that uses the refreshing scheme described above, the polarity of the entire data page is inverted or un-inverted, and therefore the data page can be recovered using the embodiments described above for the SLC case.

The described methods are applicable to higher capacity devices such as TLC devices that store 3 bits/cell, or even higher capacity devices. For example, for a TLC device, the refreshing scheme comprises three refreshing steps, wherein in each step a data page of one bit significance value may be inverted in its entirety.

The embodiments, described above are given by way of example, and alternative suitable embodiments can also be used.

In the example above, a group of memory cells stores multiple data pages having respective bit significance values, and the refreshing scheme inverts only one of the stored data pages in each refreshing cycle. In alternative embodiments, the refreshing scheme may invert some or all of the data pages in the same refreshing cycle.

Although the disclosed embodiments refer mainly to mitigating imprint effects, the disclosed techniques are applicable to memory devices of any technology in which mitigating impairments of relevant types involves refreshing the stored data with inversion.

Although the disclosed embodiments mainly refer to nonvolatile memories, the embodiments are applicable to volatile memories as well.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A memory controller, comprising:
an interface configured to communicate with a memory device comprising multiple memory cells, the memory device configured to refresh the memory cells by repeatedly inverting data stored in the memory cells; and
circuitry configured to:
encode input data into a Code Word (CW) using an Error Correction Code (ECC) that generates multiple parity bits, wherein both the CW and an inverted version of the CW in which a predefined group of one or more of the parity bits are inverted comprise valid code words of the ECC;
store the CW in a group of the memory cells;
read the stored CW from the group of the memory cells to produce read data, wherein due to the refresh of the memory cells in the group, the read data has an actual polarity that is either un-inverted or inverted;
identify the actual polarity of the read data by decoding the ECC of the read data to produce decoded data; and
recover the input data from the decoded data based on the identified actual polarity.

2. The memory controller according to claim 1, wherein the circuitry is configured to identify the actual polarity without receiving an explicit indication of the actual polarity from the memory device.

3. The memory controller according to claim 1, wherein the multiple parity bits comprise first parity bits and second parity bits, such that encoding the input data and encoding an inverted version of the input data results in respective CWs having same first parity bits and mutually-inverted second parity bits.

4. The memory controller according to claim 3, wherein the circuitry is further configured to:
perform to the read data at least one of a first ECC decoding operation that decodes the read data directly to generate first decoded data, and a second ECC decoding operation that decodes the read data after inverting the first parity bits to generate second decoded data; and
identify the actual polarity of the read data based on pass/fail outcomes of the at least one of the first ECC decoding operation and the second ECC decoding operation.

5. The memory controller according to claim 4, wherein the circuitry is configured to identify that the actual polarity is un-inverted when the first ECC decoding operation succeeds and the second ECC decoding operation fails, and to recover the input data by outputting the first decoded data.

6. The memory controller according to claim 4, wherein the circuitry is configured to identify that the actual polarity is inverted when the second ECC decoding operation succeeds and the first ECC decoding operation fails, and to recover the input data by inverting the second decoded data.

7. The memory controller according to claim 4, wherein the circuitry is configured to report a readout failure when the first ECC decoding operation and the second ECC decoding operation have both failed, or both succeeded.

8. The memory controller according to claim 4, wherein the circuitry is configured to perform the first ECC decoding operation, and to subsequently perform the second ECC decoding operation only in response to identifying that the first ECC decoding operation has failed.

9. The memory controller according to claim 1, wherein the memory cells in the group store multiple encoded data pages having respective bit significance values, wherein each encoded data page corresponds to respective input data that was encoded using the ECC, and wherein the circuitry is configured to read one of the encoded data pages stored in the group, and to identify the actual polarity and recover the input data of the one of the encoded data pages.

10. The memory controller according to claim 1, wherein the memory cells of the memory device comprise ferroelectric memory cells.

11. A method, comprising:
encoding input data into a Code Word (CW) using an Error Correction Code (ECC) that generates multiple parity bits, wherein both the CW and an inverted version of the CW in which a predefined group of one or more of the parity bits are inverted comprise valid code words of the ECC;
storing the CW in a group of memory cells of a memory device, which applies refreshing to the memory cells by repeatedly inverting the data stored in the memory cells;
reading the stored CW from the group of the memory cells to produce read data, wherein due to the refreshing of the memory cells in the group, the read data has an actual polarity that is either un-inverted or inverted;
identifying the actual polarity of the read data by decoding the ECC of the read data to produce decoded data; and
recovering the input data from the decoded data based on the identified actual polarity.

12. The method according to claim 11, wherein identifying the actual polarity comprises identifying the actual polarity without receiving an explicit indication of the actual polarity from the memory device.

13. The method according to claim 11, wherein the multiple parity bits comprise first parity bits and second parity bits, such that encoding the input data and encoding an inverted version of the input data results in respective CWs having same first parity bits and mutually-inverted second parity bits.

14. The method according to claim 13, wherein decoding the ECC of the read data comprises performing at least one of a first ECC decoding operation that decodes the read data directly to generate first decoded data, and a second ECC decoding operation that decodes the read data after inverting the first parity bits to generate second decoded data, and wherein identifying the actual polarity of the read data comprises identifying the actual polarity of the read data based on pass/fail outcomes of the at least one of the first ECC decoding operation and the second ECC decoding operation.

15. The method according to claim 14, wherein identifying the actual polarity comprises identifying that the actual polarity is un-inverted when the first ECC decoding operation succeeds and the second ECC decoding operation fails, and wherein recovering the input data comprises outputting the first decoded data.

16. The method according to claim 14, wherein identifying the actual polarity comprises identifying that the actual polarity is inverted when the second ECC decoding operation succeeds and the first ECC decoding operation fails, and wherein recovering the input data comprises inverting the second decoded data.

17. The method according to claim 14, and comprising reporting a readout failure when the first ECC decoding operation and the second ECC decoding operation have both failed, or both succeeded.

18. The method according to claim 14, wherein decoding the ECC of the read data comprises performing the first ECC decoding operation, and subsequently performing the second ECC decoding operation only in response to identifying that the first ECC decoding operation has failed.

19. A storage system, comprising:
a memory comprising multiple memory cells, the memory is configured to refresh the memory cells by repeatedly inverting data stored in the memory cells; and
a controller, which is configured to:
encode input data into a Code Word (CW) using an Error Correction Code (ECC) that generates multiple parity bits, wherein both the CW and an inverted version of the CW in which a predefined group of one or more of the parity bits are inverted comprise valid code words of the ECC;
store the CW in a group of the memory cells;
read the stored CW from the group of the memory cells to produce read data, wherein due to the refresh of the memory cells in the group, the read data has an actual polarity that is either un-inverted or inverted;
identify the actual polarity of the read data by decoding the ECC of the read data to produce decoded data; and
recover the input data from the decoded data based on the identified actual polarity.

20. A memory controller, comprising:
an interface configured to communicate with a memory device comprising multiple memory cells, the memory device configured to refresh the memory cells by repeatedly inverting data stored in the memory cells; and
circuitry configured to:
set a given bit of input data to a predefined value;
encode the input data with the given bit set into a Code Word (CW) using an Error Correction Code (ECC) that generates multiple parity bits, such that encoding the input data and an inverted version of the input data results in same values of the multiple parity bits;
store the CW in a group of the memory cells;
read the stored CW from the group of the memory cells to produce read data, wherein due to the refresh of the memory cells in the group, the read data has an actual polarity that is either un-inverted or inverted;
decode the ECC of the read data to produce decoded data;
identify the actual polarity of the decoded data by checking the polarity of the given bit in the decoded data; and
recover the input data from the decoded data based on the identified actual polarity.

* * * * *